DIRECT-COUPLED DIFFERENTIAL-INPUT AMPLIFIER

Filed Jan. 16, 1968

David R. Breuer,
INVENTOR.
BY.
Edin A. Osn.
ATTORNEY.

3,480,872

DIRECT-COUPLED DIFFERENTIAL-INPUT AMPLIFIER

David Roy Breuer, Malibu, Calif., assignor to TRW Inc., Redondo Beach, Calif., a corporation of Ohio Filed Jan. 16, 1968, Ser. No. 698,239
Int. Cl. H03f 3/68
U.S. Cl. 330—30 3 Claims

ABSTRACT OF THE DISCLOSURE

A direct-coupled differential-input amplifier suitable for use with a monolithic integrated circuit. The amplifier has a differential signal input circuit and a common-mode feedback loop for maintaining the amplification or the bias level of the input transistors constant in spite of variations of the average or common-mode input voltages. Additionally the circuit has high stability under varying temperatures. This is effected by injecting operating currents into the transistors having a substantially temperature independent and a linearly temperature dependent component. By adjusting the magnitudes of the two current components, output voltage variations due to temperature changes can be substantially eliminated. The common-mode rejection and the temperature compensation functions are separate and may be independently controlled.

The invention described herein was made in the performance of work under a NASA contract and is subject to the provisions of Section 305 of the National Aeronautics and Space Act of 1958, Public Law 85-568.

BACKGROUND OF THE INVENTION

This invention relates generally to differential-input amplifiers and particularly to such a direct-coupled amplifier having a high common-mode rejection and which may be manufactured in the form of a monolithic integrated circuit.

Direct-coupled differential amplifiers are well known in the art. They find application for example for amplifying small signals obtained from transducers over relatively long leads or cables. Accordingly, the so-called common-mode signal which is the signal appearing on both input leads may be many orders of magnitude larger than the desired or differential-mode signals, the latter being the signal between the input leads. Accordingly such amplifiers must exhibit high common-mode rejection and should be very stable, that is, direct-current drifts must be eliminated.

This is conventionally accomplished by the use of chopper-stabilized amplifiers. These will minimize direct-current drifts such as those occasioned by variations of the ambient temperature.

However, chopper-stabilized amplifiers have various disadvantages. Due to the chopping of the input signal, noise is introduced into the system which may exhibit itself by chopping spikes. Furthermore, chopper-stabilized amplifiers have undesirable dynamic characteristics. Finally, it is well known that they are bulky and relatively expensive because they require large capacitors and other extra equipment. They are not suitable for mass production in the form of monolithic integrated circuits which are cheaper to manufacture.

It is accordingly an object of the present invention to provide a direct-coupled differential-input amplifier of a type which may be manufactured in the form of a monolithic integrated circuit.

Another object of the invention is to provide a differential amplifier of the character described which has large common-mode rejection and high stability of its bias level under various conditions.

A further object of the present invention is to provide a differential-input amplifier with high common-mode rejection and having an output voltage substantially independent of temperature variations, the rejection and temperature compensating functions being independent of each other.

SUMMARY OF THE INVENTION

In accordance with the present invention there is provided a direct-coupled differential-input amplifier. The amplifier may have a differential input and single-ended output. Thus the input terminals provide a differential-mode input signal having an undesired common-mode component.

The input circuit includes a pair of transistors. The input signals are impressed on the bases of the two transistors while the output signals are obtained from their collectors. A first or stabilizing amplifier has one input terminal connected to a first point of reference potential. The stabilizing amplifier serves the function to stabilize the bias levels of the input transistors in spite of variations of the common-mode currents.

There is also provided a second amplifier which may be called a differential-mode amplifier, which amplifies the average of common-mode and difference or differential-mode components of the input stage output currents. This second amplifier has a first output terminal where the undesired common-mode component appears. This may be considered to be simply an output which is proportional to the average of the input stage output currents. This output terminal of the differential-mode amplifier is connected to the input terminal of the stabilizing amplifier.

The common-mode feedback loop is completed by a resistive feedback network connected between the other output terminal of the differential-mode amplifier and a second point of reference potential such as ground. Two points on the resistive feedback network are connected to the two emitters of the input transistors. Additionally an intermediate point in the resistive network is connected to the output terminal of the stabilizing amplifier. This serves the purpose to maintain substantially constant the common-mode currents flowing through the transistors.

If needed, temperature stabilization may be effected by supplying the two points at which the feedback network connects to the emitters of the input transistors with currents which are partly temperature independent and partly linearly dependent on temperature. This makes it possible to provide an overall output voltage which is substantially independent of temperature variations.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

DESCRIPTION OF THE PREFERRED EMBODIMENT

Figure 1:
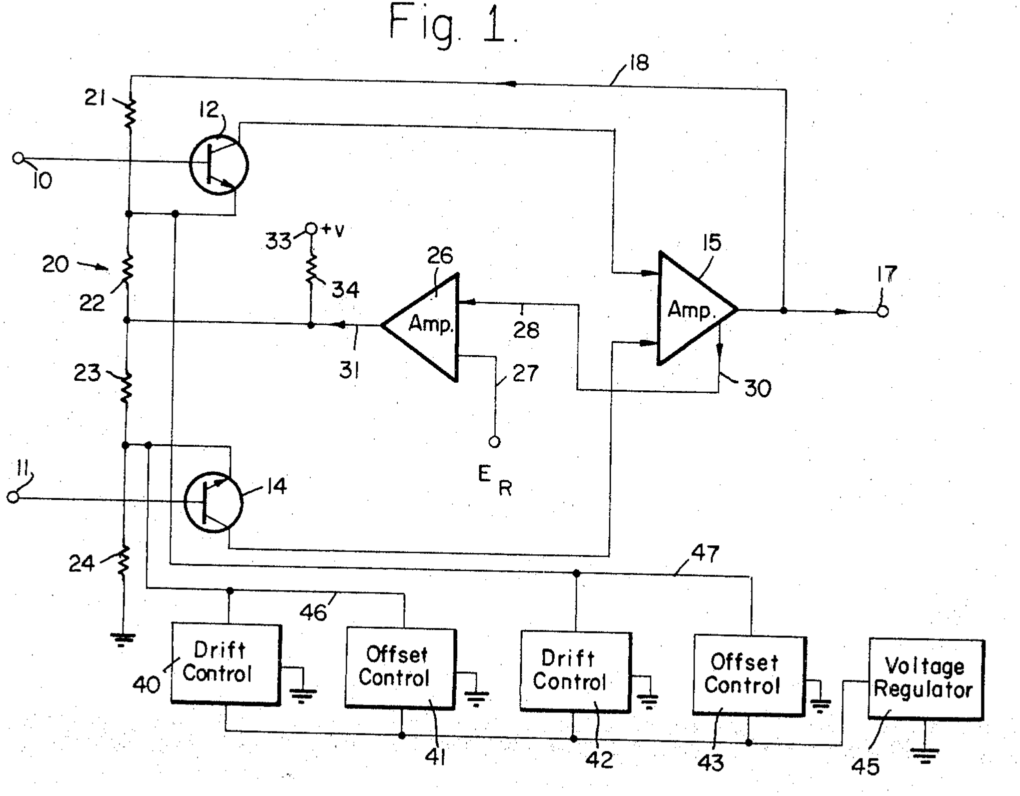
FIG. 1 is a circuit diagram, partly in block form, of a differential-input amplifier embodying the present invention.
Figure 2:
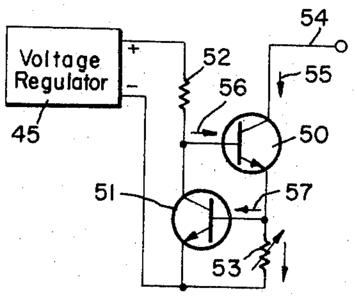
FIG. 2 is a circuit diagram of a current source for delivering an output current which is linearly dependent on temperature variations and which may be used with the amplifier circuit of FIG. 1.
Figure 3:
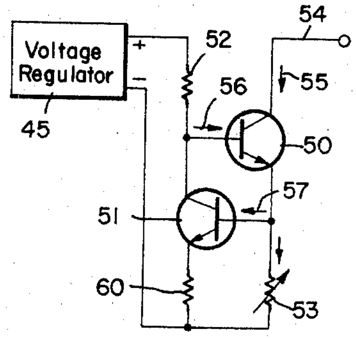
FIG. 3 is a circuit diagram of a modified current source for delivering an output current which is substantially independent of temperature variations and which may also be used with the amplifier of FIG. 1.

Referring now to the drawing, there is illustrated in FIG. 1 a differential-input amplifier embodying the present invention. This amplifier is claimed in the present application. FIGS. 2 and 3 illustrate current sources which are respectively linearly dependent upon or substantially independent of temperature variations. The current sources of FIGS. 2 and 3 may be used with the amplifier of FIG. 1, although the amplifier of FIG. 1 may utilize other previously known current sources. The current sources of FIGS. 2 and 3 are claimed in the co-pending application of the present inventor, entitled "Temperature Compensated Current Source," filed concurrently herewith and assigned to the assignee of the present invention.

The differential amplifier of FIG. 1 has a pair of input terminals 10 and 11 from which the differential-mode input signal is available. As explained before, the differential-mode signal is the desired signal between terminals 10 and 11 and preferably is an input voltage. The undesired common-mode component is that component which is common to the two input terminals 10 and 11. Typically the common-mode component may be on the order of volts, while the desired differential-mode signal may be as low as microvolts.

The input signal is impressed on a pair of input transistors 12 and 14 which, as shown may be of the n-p-n type. In any case they should both be of the same conductivity type. The input signals are impressed on the two bases of the input transistors 12 and 14, and accordingly the input terminals 10 and 11 are respectively connected to the two bases.

The output signal is obtained from the two collectors of the two input transistors 12 and 14 and is directly impressed on the two input terminals of an amplifier 15 which may be called the differential-mode amplifier. The differential-mode amplifier 15 has a single-ended output terminal 17 on which the amplified differential-mode signal is obtained.

A feedback connection 18 is provided between the output terminal 17 of the differential-mode amplifier 15 and ground and includes a resistive feedback network 20 consisting of resistors 21, 22, 23 and 24 connected in series with each other and between the amplifier output terminal 17 and ground. The feedback connection is completed to the emitters of the two input transistors 12 and 14. This emitter feedback connection is important for the operation of the amplifier of the invention. Accordingly, the junction point between resistors 21 and 22 is connected to the emitter of transistor 12. Similarly, the junction point between resistors 23 and 24 is connected to the emitter of transistor 14.

Further in accordance with the present invention, there is provided a high-gain common-mode feedback loop including a stabilizing amplifier 26. The amplifier 26 has one input terminal 27 connected to a point of reference potential shown as $E_R$. This may be any suitable stable voltage including ground. The other input terminal 28 of the stabilizing amplifier 26 is connected to an output terminal 30 of the differential-mode amplifier 15. From this output terminal 30 there is available the common-mode signal. This may be considered proportional to the average collector currents of the input transistors 12 and 14. The stabilizing amplifier 26 accordingly develops an output current at its output terminal 31 having a magnitude which depends on the difference of the voltages at its input terminals 27 and 28. In other words, it develops an output current which varies with variations of the common-mode signal.

In order to complete the common-mode feedback loop, the output terminal 31 of the stabiliizng amplifier 26 is connected to the junction between resistors 22 and 23. Thus the emitter currents of the input transistors 12 and 14 are held constant under conditions of changing currents in the resistive feedback network 20. A positive voltage source 33 may be connected to the amplifier output terminal 31 by a resistor 34 as shown.

As stated above, it is the function of the stabilizing amplifier 26 to develop an output current of a magnitude and direction to compensate for variations of the common-mode voltage component at the input terminals 10 and 11. Stated another way, the common-mode feedback loop including the stabilizing amplifier 26 controls the operating bias levels for the transistors 12 and 14 so that the overall gain of the differential-mode amplifier remains constant in spite of variations of the common-mode input voltage component.

The amplifier circuit as described so far has a differential input and a single-ended output and affords a high rejection of the common-mode component. The common-mode rejection may be at least as large as 100 db (decibels). On the other hand, the amplifier circuit as described so far does not compensate for possible temperature drift nor for inherent voltage offset. Thus the amplifier is operative if it is maintained at a constant temperature and if the inherent voltage offset can be minimized for any particular application. However, if the ambient temperature varies over a wide range, say, from −40° C. (centigrade) to +100° C., some provision must be made to prevent output signal variations with temperature variations.

In accordance with the present invention, this is effected by the provision of a drift control circuit 40 and an offset control circuit 41 for supplying current to the emitter of transistor 14, and a similar drift control circuit 42 and offset control circuit 43 for supplying operating current to the input transistor 12. The two drift control circuits 40 and 42 are designed to develop an output current which varies linearly with temperature variations. Hence they compensate for temperature drifts. On the other hand, the offset control circuits 41 and 43 control current offset and deliver an output current which is substantially independent of temperature variations.

To explain the functions of the drift control circuits 40, 42 and of the offset control circuits 41, 43, we may consider a plot of the voltage as a function of temperature variations. It is the function of the drift control circuits to control the slope of the voltage-versus-temperature curve. On the other hand, the offset control circuit controls the absolute value of the voltage. In other words, this makes it possible to have a zero output voltage for a zero input voltage, provided the slope of the curve has been made 0° by proper control of the drift control circuits.

The control circuits 40 through 43 may each have an input connected to a voltage regulator 45 for supplying thereto a regulated input voltage. As shown, the other terminal of the voltage regulator 45 and of the control circuits 40 to 43 may be grounded. The drift and offset control circuits 40 and 41 have an output lead 46 connected to the emitter of transistor 14. Similarly, the drift and offset control circuits 42 and 43 have an output lead 47 connected to the emitter of input transistor 12.

It has been found that by adjusting the relative components of the currents delivered by the drift and offset control circuits 40 and 41, or 42 and 43, the amplifier can be so adjusted that the differential-mode signal obtained at output terminal 17 is rendered substantially independent of temperature variations. Also the differential-mode signal at output terminal 17 may be made zero for a zero input signal. Actually it has been found that the temperature drift for a temperature range between −40° C. and +100° C. my be maintained to be less than 0.05 $\mu$v./° C. ($\mu$v. indicating microvolts).

It will also be appreciated that current sources such as the drift control circuits 40 and 42 which deliver an output current linearly dependent on temperature variations are well known. Similarly, offset control circuits such as 41 and 43 which deliver an output current substantially independent of temperature variations are also well known. However, it has been found that the circuits illustrated in FIGS. 2 and 3 are particularly suitable for this purpose.

The following formula shows why the output voltage of the amplifier of FIG. 1 can be made independent of temperature. In the following formula $v_0$ is the output voltage obtained at output terminal 17. $I_A$ indicates the current flowing in the lead 47. Similarly, $I_B$ is the current flowing in lead 46. Furthermore, $v_{iA}$ is the input voltage at input terminal 10, while $v_{iB}$ is the other input voltage at the terminal 11. Finally, $R_3$ is the combined resistance of resistors 22 and 23, and $R_2$ is the combined resistance of resistors 21 and 24. The following formula is thus obtained for $v_o$:

$$v_o=(I_A-I_B)R_2+(v_{iA}-v_{iB})\frac{(R_2+R_3)}{R_3} \quad (1)$$

Formula 1 shows that $v_o$ may be made temperature independent by a proper adjustment of the currents $I_A$ and $I_B$, because both currents contain separately a temperature independent and a linearly temperature dependent component. Thus by adjustment of the relative currents obtained from the drift control circuits 40 and 42 compared to the currents obtained from the offset control circuits 41 and 43, the output voltage $v_o$ may be made temperature independent. The voltage $v_o$ may also be made zero for a zero input signal, that is, when $v_{iA}$ equals $v_{iB}$. This is the function of the offset control.

Referring now to FIG. 2, there is illustrated a transistor circuit which may be considered as a current source delivering an output current which is a linear function of the temperature. Accordingly the circuit of FIG. 2 may be used to obtain the drift control shown at 40 and 42 in FIG. 1. The circuit of FIG. 2 includes a pair of transistors 50 and 51 which may be of the n-p-n type as shown. In any case they should both be of the same conductivity type.

The two transistors 50 and 51 are connected directly to each other to form a feedback loop. Accordingly the collector of transistor 51 is connected directly to the base of transistor 50. Similarly, the emitter of transistor 50 is directly connected to the base of transistor 51.

As mentioned before, the transistors are preferably supplied with a regulated voltage from the voltage regulator 45. Thus the positive terminal of the voltage regulator may be connected by a resistor 52 to the base of transistor 50 and the collector of transistor 51. The negative terminal of the voltage regulator 45 is directly connected to the emitter of transistor 51. The emitter of transistor 50 and the base of transistor 51 are connected through a resistor 53 to the emitter of transistor 51 and to the negative terminal of the voltage regulator. Finally, the output current is obtainable from the output terminal 54 connected to the collector of transistor 50.

With the voltages of the voltage regulator and the conductivity types of the two transistors as shown, current flows into the collector of transistor 50, as shown by the arrow 55. There is further a closed current loop which may be traced from the collector of transistor 51 to the base of transistor 50, as shown by arrow 56, and then through the emitter of transistor 50 and the base of transistor 51, as shown by the arrow 57.

It will be realized that the alpha of a junction transistor generally varies nonlinearly with temperature. The alpha of a transistor is defined as the variation of the collector current with variations of the emitter current, the voltage between collector and emitter being maintained constant. Similarly, the beta of a transistor is defined as the variation of the emitter current with variations of the base current, the voltage between collector and base being maintained constant.

For further discussion it will be assumed that the two transistors 50 and 51 are closely matched with respect to their alphas and betas. In other words, we have to assume that the collector currents of the two transistors, as well as the betas of the two transistors, are approximately equal. In that case their base currents will also be equal. Accordingly, if the collector current of transistor 51 is approximately constant with temperature, the change of the voltage drop between base and emitter of transistor 51 will be extremely linear with temperature. Accordingly, the current through resistor 53 equals the output current which is shown by the arrow 55. The reason is that equal currents flow as shown by the arrows 56 and 57. Therefore the output current is also a very linear function of temperature.

Since equal currents flow in the directions shown by arrows 56 and 57, it will be apparent that the output current also flows through resistor 53. Therefore the magnitude of the output current may be controlled by varying the resistance of the resistor 53 as shown. This is the manner in which the drift control circuits 40 and 42 may be adjusted.

The circuit of FIG. 2 may be mathematically analyzed and the following formula may be obtained:

$$I=\frac{\left(1-\frac{R}{\beta_1R_1}\right)\frac{V_1}{R}+\frac{1}{\beta_1R_1}(E-V_2)}{1+\frac{1}{\beta_1}+\frac{1}{\beta_1\beta_2}} \quad (2)$$

In the above formula, I is the output current, that is, the current flowing through the output terminal 54. R is the resistance of resistor 53. $\beta_1$ is the beta of transistor 51. $\beta_2$ is the beta of transistor 50. $R_1$ is the resistance of resistor 52. E is the output voltage developed by voltage regulator 45. $V_1$ is the base-emitter voltage of transistor 51, and $V_2$ is the base-emitter voltage of transistor 50.

Assuming that $1/\beta_1$ may be neglected with respect to 1, and that $1/\beta_2$ may be neglected with respect to 1, Formula 2 may be simplified as follows:

$$I\simeq\frac{V_1}{R} \quad (3)$$

This condition may be expressed another way, namely, if $\beta_1$ and $\beta_2$ is each larger than 100, the reciprocal of beta certainly can be neglected with respect to 1.

Formula 3 shows that I, the output current, is a linear function of temperature because $V_1$ is a linear function of temperature, as are the betas of the transistors.

Accordingly, the circuit of FIG. 2 will deliver an output current which is a linear function of temperature under the conditions referred to above. The circuit may be used for the drift control circuits 40 and 41. Also the magnitude of the output current may be adjusted by adjusting the resistance of resistor 53.

By a simple modification the circuit of FIG. 2 may be made to deliver an output current which is substantially independent of temperature. This is illustrated in FIG. 3. The circuit of FIG. 3 is identical to that of FIG. 2 except that a resistor 60 is connected between the emitter of transistor 51 and the negative terminal of the voltage regulator 45.

In the circuit of FIG. 3 there is a 100% feedback loop between the two transistors 50 and 51. Accordingly the voltage across resistor 53 is stabilized with temperature if the ratio of the resistance of resistor 60 to that of resistor 52 is equal to the alpha of transistor 51 which is in the neighborhood of one. It should also be assumed that the voltage gain of the network consisting of transistor 51, resistor 52 and resistor 60 is unity. It has already been explained that the output current flow through output terminal 52 is equal to the current through resistor 53. Therefore it will be apparent that the output current is constant with temperature and is inversely proportional to the resistance of resistor 53. In other words, the magnitude of the output current may again be adjusted by an adjustment of the resistance of resistor 53. As pointed out before, this affords a simple manner in which the output current of the offset control circuits 41 and 43 may be adjusted.

The temperature independence of the output current of the voltage source of FIG. 3 may also be shown mathematically as follows. Assuming that the resistances of resistors 52 and 60 are equal, the output current I is determined by the following formula:

$$I=\frac{1}{R}\times\frac{\left[1+\frac{1}{\beta_1}\left(1+\frac{R}{R_1}\right)\right]E+\left(1+\frac{1}{2\beta_1}\right)\left(V_1-V_2-\left[\frac{1}{2\beta_1}\left(1+\frac{2R}{R_1}\right)(V_1+V_2)\right]\right)}{2\left[1+\frac{1}{2\beta_1}+\frac{1}{\beta_2}\left(1+\frac{1}{\beta_1}\right)\left(1+\frac{R_1}{2R}\right)\right]} \quad (4)$$

This Formula 4 may again be simplified provided the previous assumption is true that the reciprocals of the betas of the two transistors may be neglected compared to 1; or, put in other words, that the betas of the two transistors should be no less than 100. Furthermore, we assume that the input voltage E is greater than $2V_1$ or $2V_2$. The reason for that is that the input voltage should be larger than the voltage drops between the base and emitters of the two transistors connected in cascade. Practically, the input voltage E should be greater than $10V_1$ or $10V_2$. With these assumptions, Formula 4 may be simplified as follows:

$$I\simeq\frac{E}{2R} \quad (5)$$

Formula 5 shows that the output current is indeed independent of temperature because both E, the input voltage, and R, the resistance of resistor 53, are assumed to be temperature independent.

It will be understood that the circuit specifications of the voltage source of FIG. 2 may vary according to the design for any particular application. However, the following circuit specifications have been found to be suitable for use with a direct-coupled differential input amplifier of the type shown in FIG. 1:

| | |
|---|---|
| Resistor **52** ohms | 130,000 |
| Resistor **53** do | 12,000 |
| Transistor **50** | Type 2N918 |
| Transistor **51** | Type 2N918 |

With the circuit specifications given above, the current source of FIG. 2 develops an output current which is a linear function of temperature and which, when plotted, deviates less than 0.1% from a straight line over a temperature range between −40° C. and +100° C.

For the current source of FIG. 3, the same transistor types may be used and the following resistance values have been found to be suitable for application as a drift control circuit of the type shown in FIG. 1:

| | |
|---|---|
| Resistor **52** ohms | 47,000 |
| Resistor **60** do | 47,000 |
| Resistor **53** do | 38,000 |

With the above circuit specifications, the current source of FIG. 3 is substantially independent of temperature within a range of −40° C. to +100° C. and is stable within 10 to 100 parts per million/° C.

As pointed out before, the circuits of FIGS. 2 and 3 are particularly suitable for use in the form of a monolithic integrated circuit. In that case the characteristics of transistors 50 and 51 will be very closely matched. It is also feasible to obtain at least a small adjustment of the resistor 53. Thus assuming that the resistors are cermet resistors which may consist, for example, of chromium with silicon monoxide having a thickness on the order of 300 A. angstrom units), the resistance may be adjusted after the circuit has been made, for example, by heating the cermet material of a particular resistor such as 53.

There has thus been disclosed a direct-coupled differential amplifier which has a high rejection for the common-mode undesired component and which may be temperature stabilized within less than 0.05 $\mu$v./° C. over a wide temperature range. Also the offset currents may be closely controlled. The common-mode feedback is independent of the function of making the output signal independent of temperature variations. As distinguished from a chopper-stabilized amplifier, the amplifier of the invention may be power-gated. In other words, it is possible to turn the amplifier instantly on and off, which makes it ideally suited for commutation systems where a plurality of channels are cyclically connected one after to an output amplifier. If all the amplifiers for the input signals must be powered continuously, this may cause a substantial power drain, particularly with a large number of input channels. The differential amplifier of the invention may be turned on and off to minimize power loss wherever time-sharing of a large number of input signals must be effected.

What is claimed is:

1. A direct-coupled, differential-input amplifier comprising:

(a) a pair of input terminals for supplying a differential-mode input signal having a common-mode undesired component;

(b) a first and a second transistor, said input terminals being connected to the bases of said transistors;

(c) a first stabilizing amplifier having a first input terminal connected to a first point of reference potential;

(d) a second differential-mode amplifier having a first output terminal where said common-mode component appears, said first output terminal being connected to the other input terminal of said first amplifier, the collectors of said transistors being connected to the input terminals of said second amplifier; and (e) a resistive feedback network connected between the other output treminal of said second amplifier where said differential-mode signal appears and a second point of reference potential, a first intermediate point on said resistive network being connected to the emitter of said first transistor, a second intermediate point on said resistive network being connected to the emitter of said second transistor, a third intermediate point on said resistive network located between said first and said second point being connected to the output terminal of said first amplifier, whereby said first amplifier maintains substantially constant the common-mode currents flowing through said transistors.

2. An amplifier as defined in claim 1 wherein a current source is connected to each of said emitters.

3. An amplifier as defined in claim 2 wherein the current delivered by said current source has a first component substantially independent of and a second component linearly dependent upon temperature variations, whereby adjustment of said current components renders the differential-mode signal voltage developed at the other output terminal of said second amplifier substantially independent of temperature variations and whereby said differential-mode signal voltage may be made zero for a zero differential-mode input signal.

References Cited

UNITED STATES PATENTS 3,434,069 3/1969 Jones 330—30

NATHAN KAUFMAN, Primary Examiner

U.S. Cl. X.R.

330—3, 9